(12) United States Patent
Li et al.

(10) Patent No.: US 12,581,836 B2
(45) Date of Patent: Mar. 17, 2026

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Wei Li, Beijing (CN); Yanbo Zeng, Beijing (CN); Heng Yang, Beijing (CN); Lian Liu, Beijing (CN); Zhangyu Xu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 500 days.

(21) Appl. No.: 18/022,683

(22) PCT Filed: May 20, 2022

(86) PCT No.: PCT/CN2022/094049
§ 371 (c)(1),
(2) Date: Feb. 22, 2023

(87) PCT Pub. No.: WO2023/221079
PCT Pub. Date: Nov. 23, 2023

(65) Prior Publication Data
US 2024/0276839 A1 Aug. 15, 2024

(51) Int. Cl.
*H10K 59/80* (2023.01)
*H10K 59/131* (2023.01)
(52) U.S. Cl.
CPC ......... *H10K 59/873* (2023.02); *H10K 59/131* (2023.02)

(58) Field of Classification Search
None
See application file for complete search history.

(56) References Cited

U.S. PATENT DOCUMENTS

| | | | | |
|---|---|---|---|---|
| 2020/0303677 A1* | 9/2020 | Lee | ....................... | H10K 50/844 |
| 2021/0028249 A1* | 1/2021 | Ding | .................. | H10D 86/0231 |
| 2022/0199943 A1 | 6/2022 | Zhang et al. | | |

FOREIGN PATENT DOCUMENTS

| | | |
|---|---|---|
| CN | 110265583 A | 9/2019 |
| CN | 111162195 A | 5/2020 |
| CN | 111725257 A | 9/2020 |
| CN | 213782041 U | 7/2021 |
| CN | 113745269 A | 12/2021 |

* cited by examiner

*Primary Examiner* — Kyoung Lee
(74) *Attorney, Agent, or Firm* — IPro, PLLC

(57) ABSTRACT

Provided are a display substrate and a display apparatus, the display substrate includes: a base substrate, having a display area, a hole area and an isolation area; at least one isolation column; an encapsulation layer, arranged on a side of the isolation column facing away from the base substrate, the encapsulation layer covers the isolation area and the display area, and a step structure is formed in a position of the encapsulation layer covering an edge of each isolation column; and an anti-oxidation layer, arranged on a side of the encapsulation layer facing away from the base substrate, an orthographic projection of the anti-oxidation layer on the base substrate covers an orthographic projection of the vertical step portion of at least one of the step structure on the base substrate.

19 Claims, 4 Drawing Sheets

DISPLAY SUBSTRATE AND DISPLAY APPARATUS

CROSS REFERENCE TO RELATED APPLICATIONS

The present disclosure is a National Stage of International Application No. PCT/CN2022/094049, filed May 20, 2022.

FIELD

The present disclosure relates to the technical field of display, in particular to a display substrate and a display apparatus.

BACKGROUND

With the development of a display technology, an organic light emitting diode (OLED for short) has promoted the diversification of display and gradually become the mainstream of the display technology. However, with the rapid development of the display technology, a user has increasingly higher requirements for a screen-to-body ratio of a display screen. In order to increase the screen-to-body ratio of the display screen, a front camera, a light sensor and other components can be arranged in holes by forming the holes in the screen.

SUMMARY

An embodiment of the present disclosure provides a display substrate and a display apparatus, and a specific solution is as follows.

A display substrate provided by an embodiment of the present disclosure, includes:

a base substrate, having a display area, a hole area and an isolation area arranged between the display area and the hole area, where the isolation area is arranged to surround the hole area;

at least one isolation column on the base substrate, where the at least one isolation column is arranged in the isolation area;

an encapsulation layer, arranged on a side of the isolation column facing away from the base substrate, where the encapsulation layer covers the isolation area and the display area; and a step structure is formed in a position of the encapsulation layer covering an edge of each isolation column, and the step structure includes at least two horizontal step portions and a vertical step portion connecting the at least two horizontal step portions; and an anti-oxidation layer, arranged on a side of the encapsulation layer facing away from the base substrate, where an orthographic projection of the anti-oxidation layer on the base substrate covers an orthographic projection of the vertical step portion of at least one of the step structure on the base substrate.

In some embodiments, in the above display substrate provided by the embodiment of the present disclosure, the orthographic projection of the anti-oxidation layer on the base substrate covers an orthographic projection of at least one of the step structure on the base substrate.

In some embodiments, in the above display substrate provided by the embodiment of the present disclosure, the orthographic projection of the anti-oxidation layer on the base substrate covers orthographic projections of all the step structures on the base substrate.

In some embodiments, in the above display substrate provided by the embodiment of the present disclosure, the orthographic projection of the anti-oxidation layer on the base substrate covers an orthographic projection of the isolation column on the base substrate.

In some embodiments, in the above display substrate provided by the embodiment of the present disclosure, the orthographic projection of the anti-oxidation layer on the base substrate covers an orthographic projection of the isolation area on the base substrate.

In some embodiments, in the above display substrate provided by the embodiment of the present disclosure, a material of the anti-oxidation layer includes metal.

In some embodiments, in the above display substrate provided by the embodiment of the present disclosure, the material of the anti-oxidation layer includes Ti.

In some embodiments, in the above display substrate provided by the embodiment of the present disclosure, the material of the anti-oxidation layer includes Ti/Al/Ti.

In some embodiments, in the above display substrate provided by the embodiment of the present disclosure, a section shape of a surface of the anti-oxidation layer facing away from the base substrate in a thickness direction of the base substrate is a straight line, a broken line, a curve or a zigzag.

In some embodiments, in the above display substrate provided by the embodiment of the present disclosure, a maximum thickness of the anti-oxidation layer ranges from 500 angstroms to 8000 angstroms.

In some embodiments, the above display substrate provided by the embodiment of the present disclosure, further includes: a luminescent material layer arranged between the isolation column and the encapsulation layer; and a cathode arranged between the luminescent material layer and the encapsulation layer; where both the luminescent material layer and the cathode cover the isolation area and the display area, and both the luminescent material layer and the cathode are arranged in a disconnected mode in a position of the isolation column.

In some embodiments, in the above display substrate provided by the embodiment of the present disclosure, in the thickness direction of the base substrate, the isolation column includes a first metal layer, a second metal layer and a third metal layer which are arranged sequentially in a stacked mode, and each side face of the second metal layer retracts inwards relative to the first metal layer and the third metal layer to form a concave portion.

In some embodiments, in the above display substrate provided by the embodiment of the present disclosure, a material of the first metal layer comprise Ti, a material of the second metal layer comprises Al, and a material of the third metal layer comprise Ti.

In some embodiments, in the above display substrate provided by the embodiment of the present disclosure, the display area includes a first source-drain metal layer and a second source-drain metal layer which are on the base substrate and arranged in a stacked mode, and the isolation column and the first source-drain metal layer are arranged on a same layer with the same material; or the isolation column and the second source-drain metal layer are arranged on a same layer with the same material.

In some embodiments, in the above display substrate provided by the embodiment of the present disclosure, a quantity of the isolation columns is multiple, and the plurality of isolation columns are distributed at intervals.

Accordingly, an embodiment of the present disclosure further provides a display apparatus, including the display substrate according to any one of the above embodiments of the present disclosure.

DETAILED DESCRIPTION OF THE EMBODIMENTS

In order to make objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are a part of the embodiments of the present disclosure, but not all of them. In addition, the embodiments in the present disclosure and features in the embodiments may be combined with each other without conflict. Based on the described embodiments of the present disclosure, all other embodiments acquired by those ordinarily skilled in the art without creative labor fall within the scope of protection of the present disclosure.

Unless otherwise defined, technical or scientific terms used in the present disclosure shall have the ordinary meanings understood by those ordinarily skilled in the art to which the present disclosure pertains. "Comprise" or "include" or other similar words used in the present disclosure indicate that an element or item appearing before such words covers listed elements or items appearing after the words and equivalents thereof, and do not exclude other elements or items. "Link" or "connect" or other similar words are not limited to physical or mechanical connection, but may include electric connection, no matter direct connection or indirect connection. "Inner", "outer", "up", "down" and the like are only used to represent a relative position relationship, and after an absolute position of a described object is changed, the relative position relationship may also be changed accordingly.

It should be noted that sizes and shapes of all figures in the accompanying drawings do not reflect a true scale, and are only intended to illustrate the content of the present disclosure. In addition, the same or similar reference numbers indicate the same or similar components or components having the same or similar functions throughout.

Figure 1:
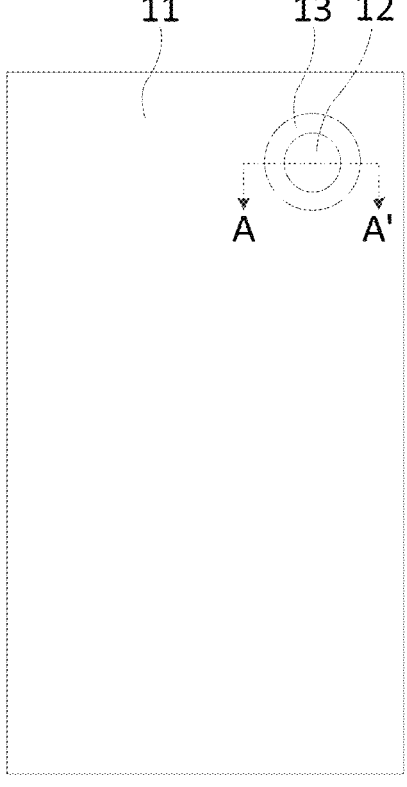
FIG. 1 is a schematic plan structural diagram of a display substrate provided by an embodiment of the present disclosure.
Figure 2:
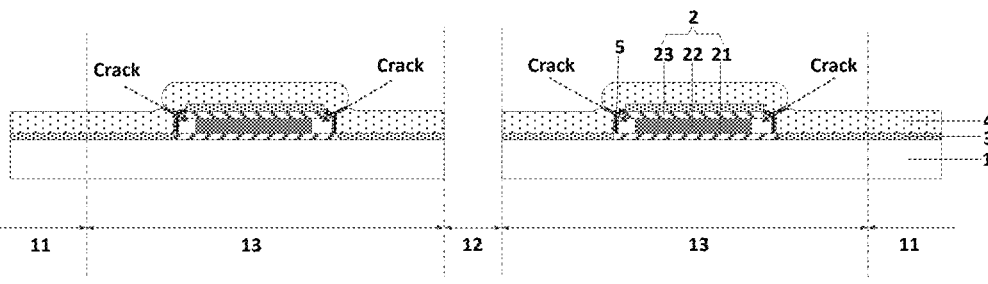
FIG. 2 is a schematic sectional structural diagram of a display substrate provided in the related art in a direction AA' in FIG. 1.

With the development of the demand for a terminal display product, the requirements for the quality and service life of an OLED display panel are becoming higher and higher, and the requirements for the encapsulation performance of the OLED display panel are also becoming higher and higher. As shown in FIG. 1, FIG. 1 is a schematic plan diagram of the OLED display panel, having a display area 11, a hole area 12 and an isolation area 13 located between the display area 11 and the hole area 12. The isolation area 13 is arranged to surround the hole area 12, that is, in order to increase a screen-to-body ratio of the display panel, the hole area 12 is formed in a screen, and a front camera, a light sensor and other components are arranged in the hole area 12. As shown in FIG. 2, FIG. 2 is a schematic sectional diagram in a direction AA' in FIG. 1. The display area 11 is provided with a drive circuit, a luminescent apparatus and other structures. The isolation area 13 is generally provided with an isolation column 2. The isolation column 2 is formed by a source-drain metal layer (a titanium-aluminum-titanium structure). In a process, usually the source-drain metal layer is laterally etched to form an undercut structure. The undercut structure can effectively isolate a luminescent material layer 3 in the luminescent apparatus, thereby interrupting or slowing down diffusion of external water vapor towards the display area 11 along the luminescent material layer 3 by the isolation column 2. However, the design of the isolation column 2 inevitably introduces a problem that during the subsequent deposition of an encapsulation layer 4, the deposition effect of the encapsulation layer 4 deposited in the undercut position of the isolation column 2 is not good, and even cracks (shown by dotted arrows) appear, consequently the encapsulation layer 4 in the undercut position is directly oxidized by the external water vapor 5 in a vertical direction, and then the external water vapor 5 connects the organic luminescent material layer 3 which has been isolated to form a complete water and oxygen channel, resulting in the invasion of the external water vapor 5 into the display area 11, making the luminescent apparatus fail.

Figure 3:
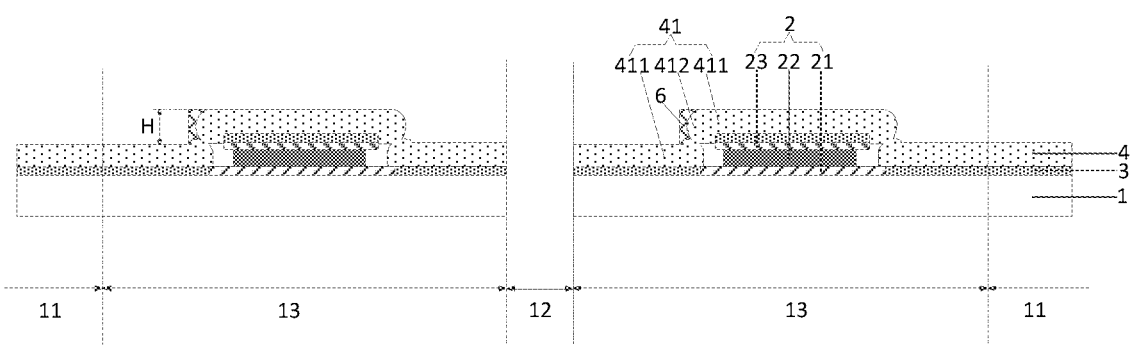
FIG. 3 to FIG. 11 are schematic sectional structural diagrams of a display substrate provided by an embodiment of the present disclosure in a direction AA' in FIG. 1.

In view of this, an embodiment of the present disclosure provides a display substrate, as shown in FIG. 1 and FIG. 3, FIG. 3 is a schematic sectional diagram in a direction AA' in FIG. 1, and the display substrate includes:

a base substrate 1, having a display area 11, a hole area 12 and an isolation area 13 arranged between the display area 11 and the hole area 12, where the isolation area 13 is arranged to surround the hole area 12;

at least one isolation column 2 on the base substrate 1, and the at least one isolation column 2 is arranged in the isolation area 13, where the embodiment of the present disclosure takes one isolation column 2 being arranged in the isolation area 13 as an example;

an encapsulation layer 4, arranged on a side of the isolation column 3 facing away from the base substrate 1, where the encapsulation layer 4 covers the isolation area 13 and the display area 11, and a step structure 41 is formed in a position of the encapsulation layer 4 covering an edge of each isolation column 2, and the step structure 41 includes at least two horizontal step portions 411 and a vertical step portion 412 connecting the at least two horizontal step portions 411; and an anti-oxidation layer 6, arranged on a side of the encapsulation layer 4 facing away from the base substrate 1, where an orthographic projection of the anti-oxidation layer 6 on the base substrate 1 covers an orthographic projection of the vertical step portion 412 of at least one of the step structure 41 on the base substrate 1.

In the above display substrate provided by the embodiment of the present disclosure, the anti-oxidation layer 6 at least covering the vertical step portion 412 of one of the step structures 41 of the encapsulation layer 4 is arranged, and can isolate external water and oxygen from a weak portion of the encapsulation layer 4 in the undercut position of the isolation column 2, which protects the encapsulation layer 4 in the undercut position, and to a large extent, weakens the oxidation of the encapsulation layer 4 in the undercut position of the isolation column 2 by the external water vapor, and thus the luminescent material layer 3 (subsequently introduced) is effectively avoided being connected in the undercut position to form a complete water and oxygen invasion channel, which can enhance the water vapor invasion resistance of an OLED display apparatus in a reliability test or a normal use process, greatly prolonging the service life of the apparatus.

It should be noted that the vertical step portion 412 described in the embodiment of the present disclosure is not necessarily of a completely vertical regular structure, and due to the influence of the production process and so on, the vertical step portion 412 may have a certain inclination angle or be irregular, and it is called the vertical step portion 412 as long as it can connect the two horizontal step portions 411 located on the disconnected luminescent material layer.

In some embodiments, the base substrate 1 may be a flexible base, such as PI.

In some embodiments, the encapsulation layer 4 may include a first inorganic layer, an organic layer and a second inorganic layer which are arranged in a stacked mode, but of course is not limited to this.

Figure 4:
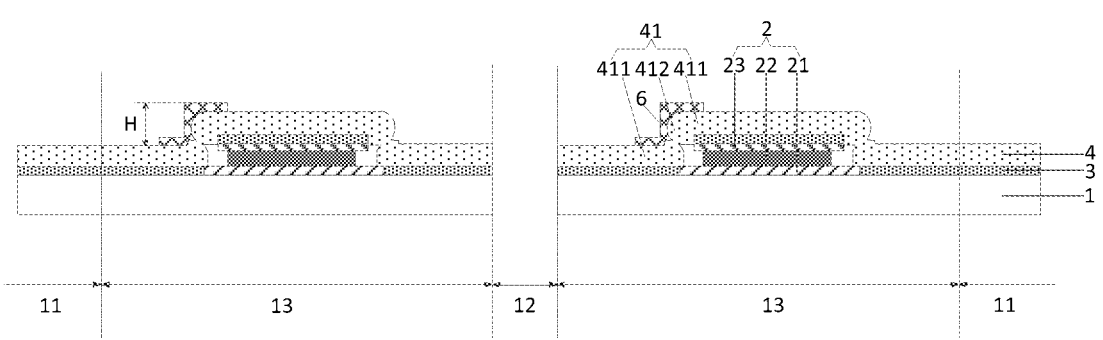

In some embodiments, in order to further weaken the oxidation of the encapsulation layer in the undercut position of the isolation column by the external water vapor, in the above display substrate provided by the embodiment of the present disclosure, as shown in FIG. 4, the orthographic projection of the anti-oxidation layer 6 on the base substrate 1 at least covers an orthographic projection of one of the step structures 41 on the base substrate 1. In this way, the area of the encapsulation layer 4 covered by the anti-oxidation layer 6 is increased, and thus the anti-oxidation layer 6 can completely isolates the external water and oxygen from the weak portion of the encapsulation layer 4 in the undercut position of the isolation column 2.

Figure 5:
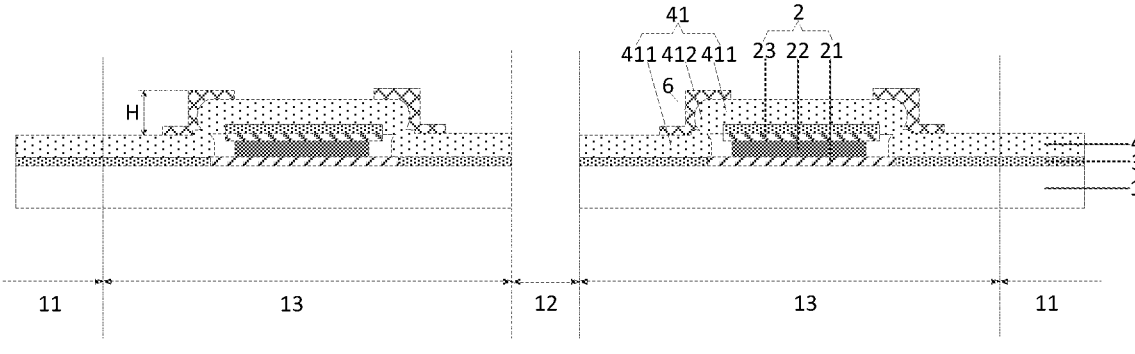

In some embodiments, in order to completely avoid the oxidation of the encapsulation layer in the undercut position of the isolation column by the external water vapor, in the above display substrate provided by the embodiment of the present disclosure, as shown in FIG. 5, the orthographic projection of the anti-oxidation layer 6 on the base substrate 1 covers orthographic projections of all the step structures 41 on the base substrate 1, and thus corrosion and oxidation from the external water vapor to the weal part of the encapsulation layer 4 in the undercut position of the isolation column 2 can be completely blocked.

Figure 6:
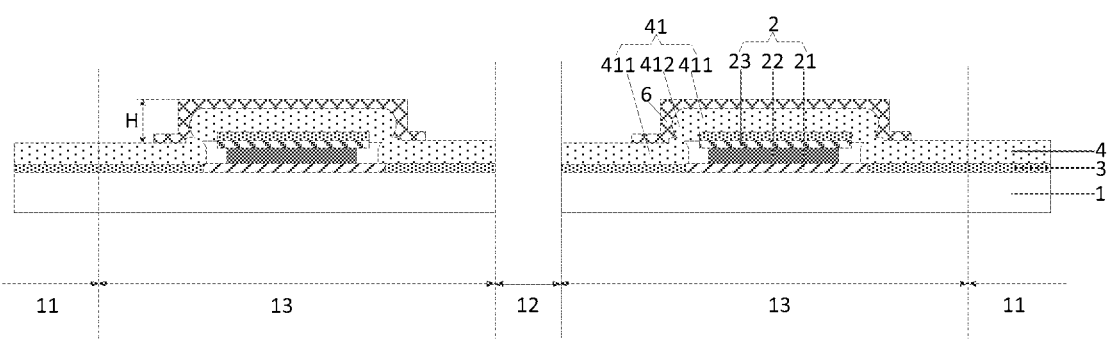

In some embodiments, while the oxidation of the part of the encapsulation layer with a weak deposition effect by the external water vapor is avoided, in order to reduce a manufacturing process, in the above display substrate provided by the embodiment of the present disclosure, as shown in FIG. 6, the orthographic projection of the anti-oxidation layer 6 on the base substrate 1 further covers the orthographic projection of the isolation column 2 on the base substrate 1.

Figure 7:
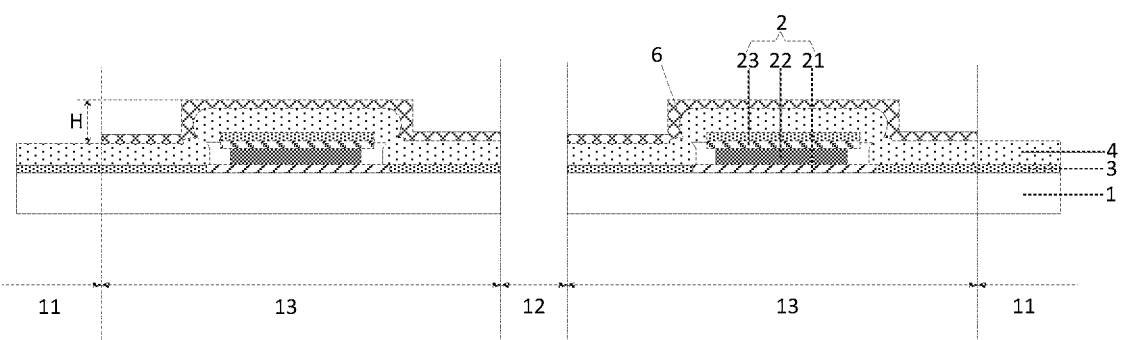

In some embodiments, while the oxidation of the part of the encapsulation layer with a weak deposition effect by the external water vapor is avoided, in order to further reduce the manufacturing process, in the above display substrate provided by the embodiment of the present disclosure, as shown in FIG. 7, the orthographic projection of the anti-oxidation layer 6 on the base substrate 1 covers the orthographic projection of the isolation area 13 on the base substrate 1. In this way, when an entire face of the anti-oxidation layer is deposited, only the part of the anti-oxidation layer 6 corresponding to the isolation area 13 needs to be retained, the rest of the anti-oxidation layer 6 is removed, and thus the manufacturing process can be reduced.

In some embodiments, in the above display substrate provided by the embodiment of the present disclosure, as shown in FIG. 3-FIG. 7, a material of the anti-oxidation layer 6 may include metal. Specifically, the material of the anti-oxidation layer 6 may include Ti. As Ti will be quickly oxidized into titanium dioxide ($TiO_2$) in the air or a hot and humid environment, thus forming a very dense and uniform passivation film, the external water vapor and the weak part of the encapsulation layer 4 in the undercut position of the isolation column 2 are isolated, the part of the encapsulation layer 4 in the undercut position is protected, the oxidation from the external water vapor on the part of the encapsulation layer 4 in the undercut position of the isolation column 2 is weakened to a large extent, and thus a luminescent material layer 3 (subsequently introduced) is effectively prevented from being connected in the undercut position to form a complete water and oxygen invasion channel.

Figure 8:
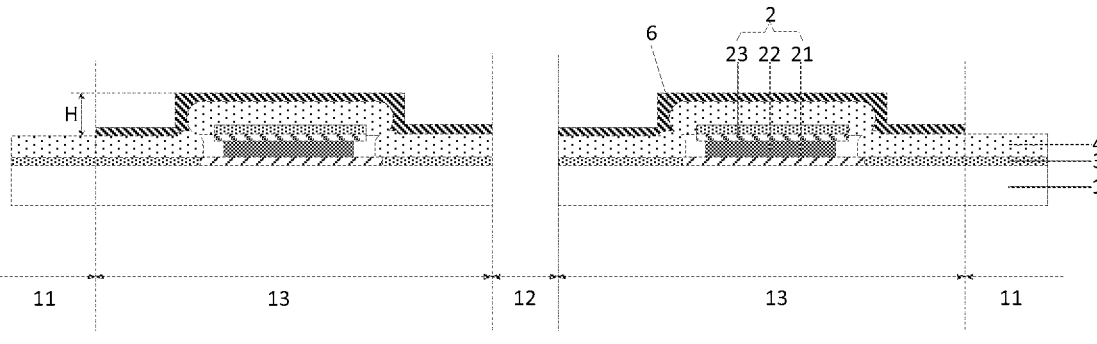

In some embodiments, in the above display substrate provided by the embodiment of the present disclosure, as shown in FIG. 8, the material of the anti-oxidation layer 6 may further include Ti/Al/Ti. Specifically, FIG. 8 shows an example of the anti-oxidation layer 6 of the material Ti/Al/Ti covering the entire isolation area 13. Of course, the anti-oxidation layer 6 of the material Ti/Al/Ti may also refer to the structure shown in the aforementioned FIG. 3-FIG. 6, which will not be repeated here.

It should be noted that since the anti-oxidation layer of the embodiment of the present disclosure only covers the iso-lation area at most, it will not have any effect on the display effect and photoelectric characteristics of the display area, the metal material used by the anti-oxidation layer is also titanium and aluminum metal widely used on products, and there is no obstacle in the difficulty of process implementation.

It should be noted that the embodiment of the present disclosure is illustrated with the example that the material of the anti-oxidation layer 6 includes Ti or Ti/Al/Ti, and of course, in some embodiments, the material of the anti-oxidation layer 6 may also be other metal materials with anti-oxidation properties.

Figure 9:
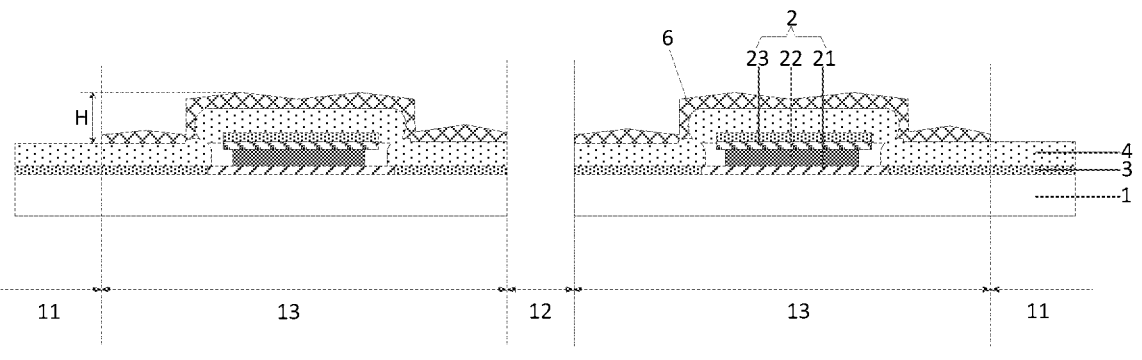
Figure 10:
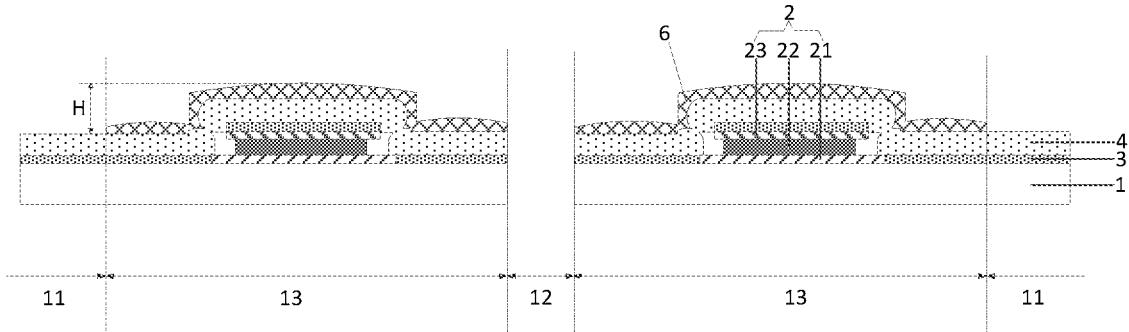
Figure 11:
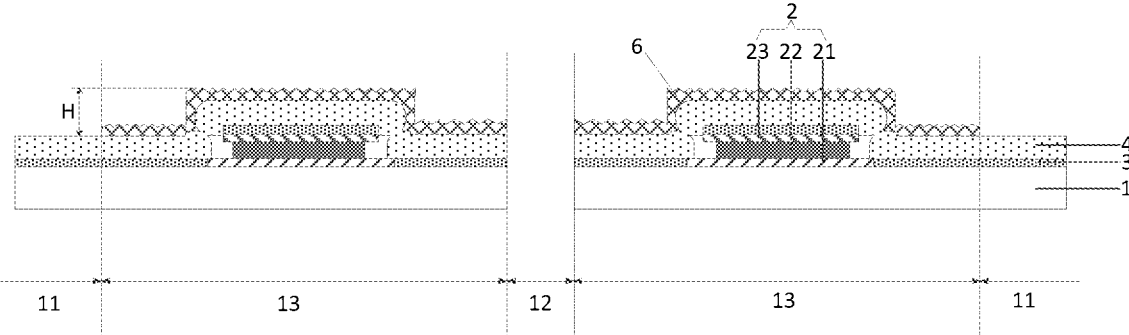

In some embodiments, in the above display substrate provided by the embodiment of the present disclosure, as shown in FIG. 3-FIG. 8, a section shape of a surface of the anti-oxidation layer 6 facing away from the base substrate 1 in a thickness direction of the base substrate 1 may be a straight line. Of course, in some embodiments, the section shape of the surface of the anti-oxidation layer 6 facing away from the base substrate 1 in the thickness direction of the base substrate 1 may also be a broken line, a curve or a zigzag. Specifically, as shown in FIG. 9, the section shape is the broken line. As shown in FIG. 10, the section shape is the curve. As shown in FIG. 11, the section shape is the zigzag. Of course, not limited to this, the anti-oxidation layer 6 is within the scope of protection of the embodiment of the present disclosure as long as it can cover the part of the encapsulation layer 4 in the undercut position.

In some embodiments, in order to ensure that the external water vapor does not oxidize the weak deposition part of the encapsulation layer 4, and ensure that the thickness of the display substrate is not too large, in the above display substrate provided by the embodiment of the present disclosure, as shown in FIG. 3-FIG. 11, the maximum thickness H of the anti-oxidation layer 6 may be taken between 500 angstroms and 8000 angstroms.

In some embodiments, the above display substrate provided by the embodiment of the present disclosure, as shown in FIG. 3-FIG. 11, further includes the luminescent material layer 3 located between the isolation column 2 and the encapsulation layer 4, and a cathode (not shown) located between the luminescent material layer 3 and the encapsulation layer 4. Both the luminescent material layer 3 and the cathode cover the isolation area 13 and the display area 11, and both the luminescent material layer 3 and the cathode are arranged in a disconnected mode in the position of the isolation column 2. Specifically, the isolation column 2 can effectively isolate the luminescent material layer 3, thereby interrupting or slowing down diffusion of the external water vapor towards the display area 11 along the luminescent material layer 3 by the isolation column 2.

In some embodiments, in the above display substrate provided by the embodiment of the present disclosure, as shown in FIG. 3-FIG. 11, in the thickness direction of the base substrate 1, the isolation column 2 includes a first metal layer 21, a second metal layer 22 and a third metal layer 23 which are arranged sequentially in a stacked mode, and each side face of the second metal layer 22 retracts inwards relative to the first metal layer 21 and the third metal layer 23 to form a concave portion. In some embodiments, when the isolation column 2 is manufactured, an entire face of the first metal film layer, an entire face of the second metal film layer and an entire face of the third metal film layer can be successively deposited, and the first metal film layer, the second metal film layer and the third metal film layer can be laterally etched to form the isolation column 2 of an I-shaped undercut structure. The isolation column 2 of the undercut structure can effectively isolate the luminescent material layer 3 and the cathode, thereby interrupting or slowing down diffusion of the external water vapor towards the display area 11 along the luminescent material layer 3 by the isolation column 2.

In some embodiments, in the above display substrate provided by the embodiment of the present disclosure, as shown from FIG. 3 to FIG. 11, materials of the first metal layer 21 and the third metal layer 23 may include Ti, and a material of the second metal layer 22 may include Al.

In some embodiments, in the above display substrate provided by the embodiment of the present disclosure, as shown from FIG. 3 to FIG. 11, the display area 11 includes a first source-drain metal layer and a second source-drain metal layer (not shown) which are located on the base substrate 1 and arranged in a stacked mode, and the isolation column 2 and the first source-drain metal layer or the second source-drain metal layer are arranged on the same layer with the same material. Specifically, the display area 11 generally includes a thin film transistor, a luminescent apparatus and other structures, the thin film transistor mainly includes a gate, an active layer and a source-drain, and the luminescent apparatus includes an anode, a luminescent material layer and a cathode. A source of the thin film transistor is electrically connected with the anode of the luminescent apparatus, and the source-drain is generally located on the first source-drain metal layer. A passivation layer, a flat layer and other insulating layers may be arranged between the source and the anode, so that the distance between the source and the anode is large, in order to ensure that the source and the anode are fully electrically connected, a lap electrode will generally be arranged between the source and the anode, and the lap electrode is located on the second source-drain metal layer. A material of the first source-drain metal layer or the second source-drain metal layer is generally titanium-aluminum-titanium, and the isolation column 2 provided by the embodiment of the present disclosure and the first source-drain metal layer or the second source-drain metal layer may be arranged on the same layer with the same material, so that it is only necessary to change original composition graphics when the first source-drain metal layer or the second source-drain metal layer is formed, and the graphics of the isolation column 2 and the first source-drain metal layer or the second source-drain metal layer can be formed through a single composition process, without adding the process of preparing the isolation column 2 separately, which can simplify the preparation process, reduce production cost and improve production efficiency.

In some embodiments, the above display substrate provided by the embodiment of the present disclosure, as shown in FIG. 3-FIG. 11, is schematically illustrated by the quantity of the isolation column 2 as one, of course, during the specific implementation, the quantity of the isolation columns 2 may be multiple, and the plurality of isolation columns 2 are distributed at intervals, so that the propagation path of the external water vapor can be better blocked.

In some embodiments, the above display substrate provided by the embodiment of the present disclosure is mainly intended to indicate that the anti-oxidation layer is arranged on the encapsulation layer of the isolation area so as to protect the weak deposition part of the encapsulation layer from being oxidized by the external water vapor. Of course, the above display substrate provided by the embodiment of the present disclosure further includes other functional film layers well known to those skilled in the art, which will not be described in detail here.

Based on the same inventive concept, an embodiment of the present disclosure further provides a display apparatus, including the above display substrate provided by the embodiment of the present disclosure. Since the display apparatus solves a problem in a similar principle to the aforementioned display substrate, the implementation of the display apparatus can refer to the implementation of the aforementioned display substrate, and the repetition will be omitted. The display apparatus may be: a cell phone, a tablet PC, a television, a displayer, a laptop, a digital photo frame, a navigator and any other products or components with display or touch functions.

In some embodiments, the above display apparatus provided by the embodiment of the present disclosure may further include other functional structures well known to those skilled in the art, which will not be described in detail here.

The embodiments of the present disclosure provide the display substrate and the display apparatus. The anti-oxidation layer at least covering the vertical step portion of one of the step structures of the encapsulation layer 4 is arranged, and can isolate the external water and oxygen from the weak portion of the encapsulation layer in the undercut position of the isolation column, so that the part of the encapsulation layer in the undercut position is protected, oxidation from the external water vapor to the part of the encapsulation layer in the undercut position of the isolation column is weakened to a large extent, and thus the luminescent material layer is effectively prevented from being connected in the undercut position to form the complete water and oxygen invasion channel, which can enhance the water vapor invasion resistance of the OLED display apparatus in the reliability test or the normal use process, greatly prolonging the service life of the apparatus.

Although preferred embodiments of the present disclosure have been described, once those skilled in the art know the basic creative concept, they may perform additional changes and modifications to these embodiments. Therefore, appended claims are intended to be construed to include the preferred embodiments and all changes and modifications falling within the scope of the present disclosure.

Apparently, those skilled in the art may perform various alterations and variations on the embodiments of the present disclosure without departing from the spirit and scope of the embodiments of the present disclosure. In this way, if the alterations and variations of the embodiments of the present disclosure fall within the scope of the claims of the present disclosure and the equivalent technology thereof, the present disclosure is also intended to include such alterations and variations.

What is claimed is:

1. A display substrate, comprising:
a base substrate, having a display area, a hole area and an isolation area arranged between the display area and the hole area, wherein the isolation area is arranged to surround the hole area;
at least one isolation column on the base substrate, wherein the at least one isolation column is arranged in the isolation area;
an encapsulation layer, arranged on a side of the isolation column facing away from the base substrate, wherein the encapsulation layer covers the isolation area and the display area; and a step structure is formed in a position of the encapsulation layer covering an edge of each isolation column, and the step structure comprises at least two horizontal step portions and a vertical step portion connecting the at least two horizontal step portions; and
an anti-oxidation layer, arranged on a side of the encapsulation layer facing away from the base substrate, wherein an orthographic projection of the anti-oxidation layer on the base substrate covers an orthographic projection of the vertical step portion of at least one of the step structure on the base substrate;
a luminescent material layer arranged between the isolation column and the encapsulation layer; and
a cathode arranged between the luminescent material layer and the encapsulation layer;
wherein both the luminescent material layer and the cathode cover the isolation area and the display area, and
an orthographic projection of the luminescent material layer on the base substrate does not overlap with an orthographic projection of the isolation column on the base substrate; and
an orthographic projection of the cathode on the base substrate does not overlap with the orthographic projection of the isolation column on the base substrate.

2. The display substrate according to claim 1, wherein the orthographic projection of the anti-oxidation layer on the base substrate covers an orthographic projection of at least one of the step structure on the base substrate.

3. The display substrate according to claim 2, wherein the orthographic projection of the anti-oxidation layer on the base substrate covers orthographic projections of all the step structures on the base substrate.

4. The display substrate according to claim 3, wherein the orthographic projection of the anti-oxidation layer on the base substrate covers an orthographic projection of the isolation column on the base substrate.

5. The display substrate according to claim 4, wherein the orthographic projection of the anti-oxidation layer on the base substrate covers an orthographic projection of the isolation area on the base substrate.

6. The display substrate according to claim 1, wherein a material of the anti-oxidation layer comprises metal.

7. The display substrate according to claim 6, wherein the material of the anti-oxidation layer comprises Ti.

8. The display substrate according to claim 6, wherein the material of the anti-oxidation layer comprises Ti/Al/Ti.

9. The display substrate according to claim 1, wherein a section shape of a surface of the anti-oxidation layer facing away from the base substrate in a thickness direction of the base substrate is a straight line, a broken line, a curve or a zigzag.

10. The display substrate according to claim 1, wherein a maximum thickness of the anti-oxidation layer ranges from 500 angstroms to 8000 angstroms.

11. The display substrate according to claim 1 wherein in the thickness direction of the base substrate, the isolation column comprises a first metal layer, a second metal layer and a third metal layer which are arranged sequentially in a stacked mode, and each side face of the second metal layer retracts inwards relative to the first metal layer and the third metal layer to form a concave portion.

12. The display substrate according to claim 11, wherein a material of the first metal layer comprise Ti, a material of the second metal layer comprises Al, and a material of the third metal layer comprise Ti.

13. The display substrate according to claim 1, wherein the display area comprises a first source-drain metal layer and a second source-drain metal layer which are on the base substrate and arranged in a stacked mode, and
the isolation column and the first source-drain metal layer are arranged on a same layer with the same material; or
the isolation column and the second source-drain metal layer are arranged on a same layer with the same material.

14. The display substrate according to claim 1, wherein a quantity of the isolation columns is multiple, and a plurality of isolation columns are distributed at intervals.

15. A display apparatus, comprising the display substrate according to claim 1.

16. The display apparatus according to claim 15, wherein the orthographic projection of the anti-oxidation layer on the base substrate covers an orthographic projection of at least one of the step structure on the base substrate.

17. The display apparatus according to claim 16, wherein the orthographic projection of the anti-oxidation layer on the base substrate covers orthographic projections of all the step structures on the base substrate.

18. The display apparatus according to claim 17, wherein the orthographic projection of the anti-oxidation layer on the base substrate covers an orthographic projection of the isolation column on the base substrate.

19. The display apparatus according to claim 18, wherein the orthographic projection of the anti-oxidation layer on the base substrate covers an orthographic projection of the isolation area on the base substrate.

* * * * *